United States Patent
Wang et al.

(10) Patent No.: US 6,803,123 B2
(45) Date of Patent: Oct. 12, 2004

(54) ORGANIC ELECTROLUMINESCENT DEVICE

(75) Inventors: Yi-Fan Wang, Hsinchu (TW); Wen-Ping Yang, Taichung (TW); Wen-Kuen Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/065,382

(22) Filed: Oct. 11, 2002

(65) Prior Publication Data

US 2004/0033387 A1 Feb. 19, 2004

(30) Foreign Application Priority Data

Aug. 16, 2002 (TW) ........................................ 91118506 A

(51) Int. Cl.$^7$ ............................................... H05B 33/12
(52) U.S. Cl. ..................... 428/690; 428/917; 428/212; 313/504; 313/506
(58) Field of Search ................................ 428/690, 212, 428/917; 313/504, 506

(56) References Cited

U.S. PATENT DOCUMENTS 6,392,250 B1 * 5/2002 Aziz et al. ..................... 257/40
6,551,725 B2 * 4/2003 Raychaudhuri et al. ...... 428/690
2001/0009351 A1 * 7/2001 Hosokawa et al. ......... 313/504

* cited by examiner

*Primary Examiner*—Dawn Garrett
(74) *Attorney, Agent, or Firm*—Jiang Chyun IP Office

(57) ABSTRACT

An organic electroluminescent device, having a cathode, an indium-tin-oxide anode, an emitting layer, a hole transport layer, an electron transport layer, a hole injecting layer and a intermediate layer. The emitting layer is located between the cathode and the indium-tin-oxide anode. The hole transport layer is located between the emitting layer and the indium-tin-oxide anode, the electron transport layer is located between the emitting layer and the cathode, the hole injecting layer is located between the hole transport layer and the indium-tin-oxide anode, and the intermediate layer is located between the hole injecting layer and the hole transport layer.

16 Claims, 2 Drawing Sheets

ORGANIC ELECTROLUMINESCENT DEVICE

CROSS REFERENCE TO RELATED APPLICATIONS

This application claims the priority benefit of Taiwan application serial no. 91118506, filed Aug. 16, 2002.

BACKGROUND OF INVENTION

1. Field of the Invention

The invention relates in general to a luminescent device, and more particularly, to an organic electroluminescent device.

2. Related Art of the Invention

The organic electroluminescent device having the characteristics of self-illumination, wide viewing angle (up to 160°), high response speed, low driving voltage, and full color has been practically applied to color flat panel displays such as a small area display panel, outdoor display panel, computer and television screen. The organic electroluminescent device uses two electrodes sandwiching an organic film with a luminescent property. When a direct voltage is applied to the organic electroluminescent device, holes are injected from the anode, while electrons are injected from the cathode. Due to the potential caused by the external electric field, carriers are mobile and recombine. A part of the energy released by the recombination of the electron and hole stimulates the luminescent molecules to a single excited state. When the excited luminescent molecules release energy and return to the ground state, a certain proportion of the energy is released to generate photons, which produce illumination. This is the mechanism for electroluminescence.

The basic structure of the conventional organic electroluminescent device includes a glass substrate, on which an emitting layer (EML) made of organic chemical is sandwiched by an indium-tin-oxide (ITO) anode and a cathode. To achieve the equilibrium between carrier injection and mobility, the organic electroluminescent device further incorporates a hole transport layer (HTL) between the emitting layer and the anode and an electron transport layer (ETL) between the emitting layer and the cathode, to inject and transport holes and electrons from the electrode, respectively, and a hole injecting layer (HIL) between the hole transport layer and the anode to inject holes into the emitting layer even when the voltage is low.

The currently available hole injecting layer is often selected from copper phthalocyanine (CuPc) material. FIG. 1 shows the graph of current density ($mA/cm^2$) versus driving voltage (V) of organic electroluminescent devices A and B using CuPc/NPB and CuPc/2T-NATA as the hole injecting/transport layer, respectively. As shown in FIG. 1, when the material with high mobility is used as the hole transport layer, the hole injection rate is significantly increased; and consequently, the driving voltage is reduced. However, when material with high mobility such as 2T-NATA is used for the hole transport layer, the recombination of the carrier is inefficient.

SUMMARY OF INVENTION

The present invention provides an organic electroluminescent device of which the hole injection rate and the luminescent efficiency are both enhanced.

The organic electroluminescent device includes a cathode, an anode, an emitting layer, a hole transport layer, an electron transport layer, a hole injecting layer and an intermediate layer. The emitting layer is formed between the cathode and the anode. The hole transport layer is formed between the emitting layer and the anode. The electron transport layer is formed between the emitting layer and the cathode. The intermediate layer with high mobility is formed between the hole transport layer and the hole injection layer. The mobility of the intermediate layer is higher than that of the hole transportation layer and the hole injection layer.

The present invention incorporates an intermediate layer with relatively high carrier mobility between the hole transport layer and the hole injection layer, such that the hole injection rate is increased while the luminescent efficiency of the organic electroluminescent device is enhanced.

BRIEF DESCRIPTION OF DRAWINGS

These, as well as other features of the present invention, will become more apparent upon reference to the drawings wherein.

DETAILED DESCRIPTION

Figure 1:
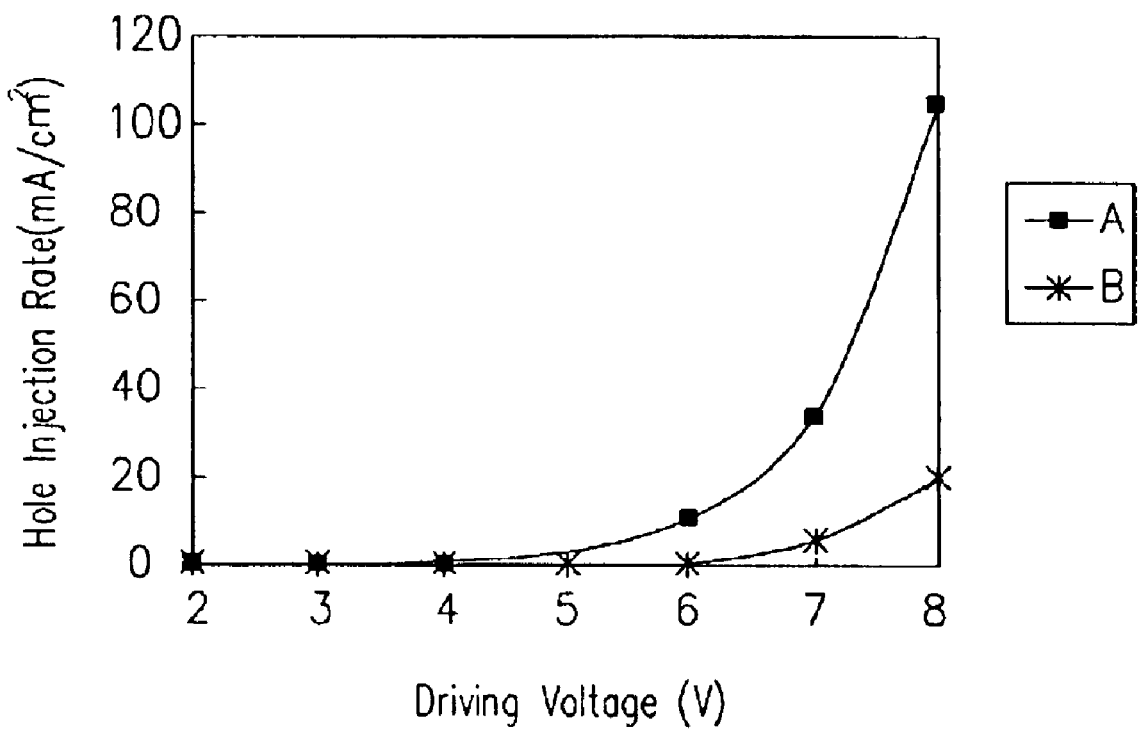
FIG. 1 shows the graph of current density versus driving voltage for the organic electroluminescent devices A and B using CuPc/NPB and CuPc/2T-NATA as the hole injection/transport layers, respectively.
Figure 2:
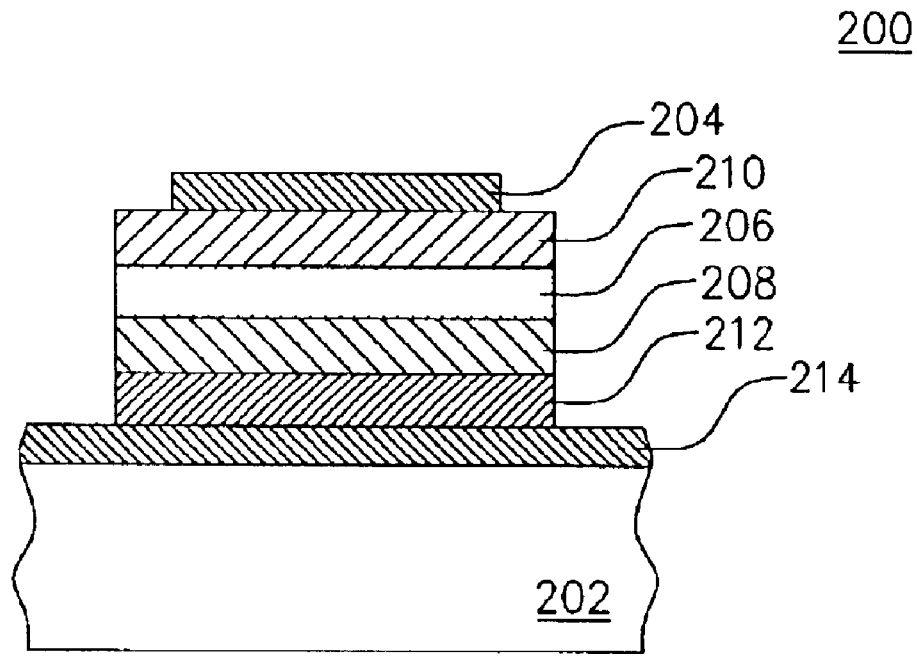
FIG. 2 shows the schematic structure of an organic electroluminescent device in one embodiment of the present invention.

FIG. 2 shows a schematic structure of an organic electroluminescent device in one embodiment of the present invention. Referring to FIG. 2, the organic electroluminescent device 200 includes an anode 202, a cathode 204, an emitting layer 206, a hole transport layer 208, an electron transport layer 210, a hole injecting layer 214 and an intermediate layer 212. The emitting layer 206 is formed between the cathode 204 and the anode 202 made of indium tin oxide (ITO). The hole transport layer 208 is formed between the emitting layer 206 and the ITO anode 202. The electron transport layer 210 is formed between the emitting layer 206 and the cathode 204. The hole injecting layer 214 is formed between the hole transport layer 208 and the ITO anode 202. The intermediate layer 212 is formed between the hole transport layer 208 and the hole injecting layer 214 with a mobility higher than that of the hole transport layer 208.

In FIG. 2, the material of the anode 202 includes indium tin oxide. The material of the cathode 204 includes magnesium/silver (Mg/Ag) alloy, lithium fluoride/aluminum (LiF/Al) or other metal material. The material of the emitting layer 206 includes Alq:DCJTB ((8-hydroxyquinoline):(4-(dicyanomethylene)-2-t-butyl-6-(1,1,7,7-tetramethyljulolidyl-9-enyl)-4H-pyran)). The material of the hole transport layer 208 includes N,N"-Di(naphthalene-1-yl)-N,N"-diphenyl-benzidine (NPB). The material of the electron transport layer 210 includes tri-(8- hydroxyquinoline) aluminum (Al₃q), PPV (poly(p-phenylene vinylene)). The material of the hole injecting layer 214 includes CuPc (copper phthalocyane), which is the derivative of phthalocyanine. The material for forming the intermediate layer 212 includes derivative of tri-phenyamine such as tris-4,4',4"-(2-naphthyl)-triphenylamine (2T-NATA). To show the organic electroluminescent device 200 has a higher efficiency than the conventional structure using CuPc/NPB as the hole injecting/transport layer, please refer to FIG. 3.

Figure 3:
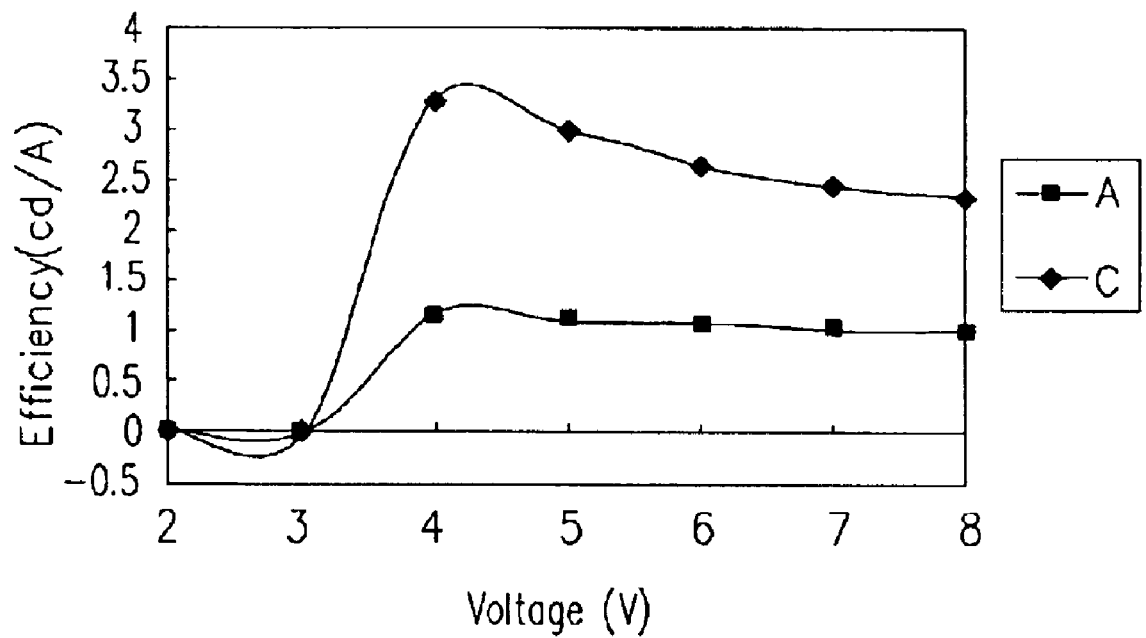
FIG. 3 shows the graph of luminescent efficiency versus voltage for the organic electroluminescent device provided by the present invention and the conventional organic electroluminescent device using CuPc/NPB as the hole injecting/transport layer.

FIG. 3 shows the graph of luminescent efficiency versus voltage for the organic electroluminescent device C and the conventional organic electroluminescent device A using CuPc/NPB as the hole injecting/transport layer. As shown in FIG. 3, when the voltage is increased up to 4V, the luminescent efficiency of the organic electroluminescnet device C is increased to about 3.5 cd/A, while the organic electroluminescent device A cannot illuminate under such low voltage even when the voltage is gradually increased. Therefore, the luminescent efficiency of the organic electroluminescent device C is shown to be higher than the conventional organic electroluminescent device using CuPc/NPB as the hole injecting/transport layer.

Figure 4:
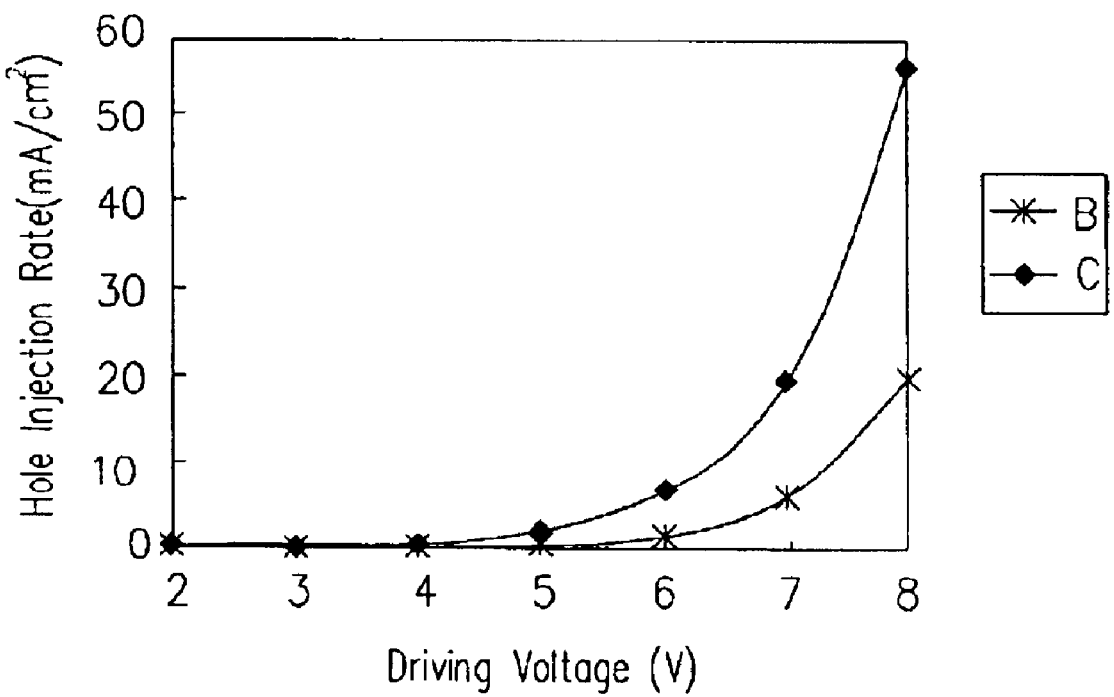
FIG. 4 shows the graph of hole injection rate versus driving voltage for the organic electroluminescent device provided by the present invention and the conventional organic electroluminescent device using CuPc/NPB as the hole injecting/transport layer.

FIG. 4 shows a graph of current density (mA/cm²) versus driving voltage (V) for the organic electroluminescent device C and the conventional organic electroluminescent device A. As the organic electroluminescent device C uses an intermediate layer with high mobility, the injection rate of the holes is thus increased.

According to the above, the present invention is characterized in forming an intermediate layer with a relatively high mobility between the hole injecting layer and the hole transport layer, such that the luminescent efficiency of the organic electroluminescent device is increased together with the increase of the hole injection rate without increasing driving voltage.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An organic electroluminescent device, comprising:
   a cathode;
   an anode under the cathode;
   an emitting layer, between the cathode and the anode;
   a hole transport layer, between the emitting layer and the anode;
   an electron transport layer, between the emitting layer and the cathode;
   a hole injecting layer, between the hole transport layer and the anode; and
   an intermediate layer, between the hole injecting layer and the hole transport layer, wherein the intermediate layer has a mobility higher than that of the hole transport layer.

2. The organic electroluminescent device according to claim 1, wherein the material of the intermediate layer includes derivative of triphenylamine.

3. The organic electroluminescent device according to claim 1, wherein the material of the intermediate layer includes derivative of tris-4,4',4"-(2-naphthyl)-triphenylamine.

4. The organic electroluminescent device according to claim 1, wherein the material of the cathode includes lithium fluoride/aluminum (LiF/Al) alloy.

5. The organic electroluminescent device according to claim 1, wherein the material of the anode includes indium tin oxide.

6. The organic electroluminescent device according to claim 1, wherein the material of the hole transport layer includes N,N'-Di(naphthalene-1-yl)-N,N'-diphenyl-benizidine) (NPB).

7. The organic electroluminescent device according to claim 1, wherein the material of the electron transport layer includes tri-(8-hydroxyquinoline) aluminum (Alq₃).

8. The organic electroluminescent device according to claim 1, wherein the material of the hole injecting layer includes derivative of phthalocyanine.

9. An organic electroluminescent device, comprising:
   a cathode;
   an anode, under the cathode;
   an emitting layer, between the cathode and the anode;
   an electron transport layer, between the emitting layer and the cathode;
   a hole transport layer, between the emitting layer and the anode;
   a hole injecting layer, between the hole transport layer and the anode; and
   an intermediate layer, between the hole injecting layer and the hole transport layer, wherein the intermediate layer having a mobility higher than that of the hole injecting layer.

10. The organic electroluminescent device according to claim 9, wherein the material of the intermediate layer includes derivative of triphenylamine.

11. The organic electroluminescent device according to claim 9, wherein the material of the intermediate layer includes derivative of tris-4,4',4"-(2-naphthyl)-triphenylamine.

12. The organic electroluminescent device according to claim 9, wherein the material of the cathode includes lithium fluoride/aluminum (LiF/Al) alloy.

13. The organic electroluminescent device according to claim 9, wherein the material of the anode includes indium tin oxide.

14. The organic electroluminescent device according to claim 9, wherein the material of the hole injecting layer includes derivative of phthalocyanine.

15. The organic electroluminescent device according to claim 9, wherein the material of the hole transport layer includes N,N'-Di(naphthalene-1-yl)-N,N'-diphenyl-benizidine) (NPB).

16. The organic electroluminescent device according to claim 9, wherein the material of the electron transport layer includes tri-(8-hydroxyquinoline) aluminum (Alq₃).

* * * * *